United States Patent
Roy et al.

(10) Patent No.: US 10,510,702 B2
(45) Date of Patent: *Dec. 17, 2019

(54) STACKED RADIO FREQUENCY DEVICES

(71) Applicant: SKYWORKS SOLUTIONS, INC., Woburn, MA (US)

(72) Inventors: Ambarish Roy, Waltham, MA (US); Yu Zhu, Wellesley, MA (US); Christophe Masse, Andover, MA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/102,630

(22) Filed: Aug. 13, 2018

(65) Prior Publication Data

US 2019/0139923 A1     May 9, 2019

Related U.S. Application Data

(63) Continuation of application No. 14/543,428, filed on Nov. 17, 2014, now Pat. No. 10,050,002.

(Continued)

(51) Int. Cl.
*H01L 23/00* (2006.01)
*H01L 23/538* (2006.01)
(Continued)

(52) U.S. Cl.
CPC .......... *H01L 24/17* (2013.01); *H01L 23/5386* (2013.01); *H01L 23/552* (2013.01);
(Continued)

(58) Field of Classification Search
CPC ......... H01L 24/13; H01L 24/16; H01L 24/17; H01L 23/5386; H01L 23/552;
(Continued)

(56) References Cited

U.S. PATENT DOCUMENTS 7,868,409 B2 * 1/2011 Sasaki ............... H01L 23/49822
257/491
10,050,002 B2 * 8/2018 Roy ..................... H01L 23/5386
(Continued)

FOREIGN PATENT DOCUMENTS

JP     2009-159222     *   7/2009     ........... H03K 17/687

*Primary Examiner* — Victoria K. Hall
(74) *Attorney, Agent, or Firm* — Chang & Hale LLP

(57) ABSTRACT

Various implementations enable management of parasitic capacitance and voltage handling of stacked integrated electronic devices. Some implementations include a radio frequency switch arrangement having a ground plane, a stack and a first solder bump. The stack is arranged in relation to the ground plane, and includes switching elements coupled in series with one another, and a first end of the stack includes a respective terminal of a first one of the plurality of switching elements. The first solder bump is coupled to the respective terminal of the first one of the plurality of switching elements such that at least a portion of the first solder bump overlaps with one or more of the plurality of switching elements, an overlap dimension set in relation to a first threshold value in order to set a respective contribution to a parasitic capacitance of the radio frequency switch arrangement.

20 Claims, 7 Drawing Sheets

Related U.S. Application Data

(60) Provisional application No. 61/906,316, filed on Nov. 19, 2013.

(51) Int. Cl.

| | | |
|---|---|---|
| *H01L 29/66* | (2006.01) | |
| *H01Q 1/00* | (2006.01) | |
| *H01L 23/552* | (2006.01) | |
| *H03K 17/687* | (2006.01) | |
| *H01L 25/07* | (2006.01) | |
| *H01L 23/66* | (2006.01) | |
| *H03K 17/10* | (2006.01) | |
| *H01L 29/417* | (2006.01) | |
| *H01L 23/50* | (2006.01) | |

(52) U.S. Cl.
CPC .............. *H01L 23/66* (2013.01); *H01L 24/13* (2013.01); *H01L 24/16* (2013.01); *H01L 25/074* (2013.01); *H01L 29/66* (2013.01); *H01Q 1/00* (2013.01); *H03K 17/102* (2013.01); *H03K 17/6871* (2013.01); *H01L 23/50* (2013.01); *H01L 29/41758* (2013.01); *H01L 2224/131* (2013.01); *H01L 2224/1302* (2013.01); *H01L 2224/141* (2013.01); *H01L 2224/161* (2013.01); *H01L 2224/16227* (2013.01); *H01L 2224/1701* (2013.01); *H01L 2224/171* (2013.01); *H01L 2924/13091* (2013.01); *H01L 2924/1421* (2013.01); *H01L 2924/30105* (2013.01); *H01L 2924/381* (2013.01)

(58) Field of Classification Search
CPC ....... H01L 23/66; H01L 23/50; H01L 25/074; H01L 29/66; H01L 29/41758; H01L 2224/1302; H01L 2224/131; H01L 2224/141; H01L 2224/161; H01L 2224/16227; H01L 2224/1701; H01L 2224/171; H01L 2924/13091; H01L 2924/1421; H01L 2924/30105; H01L 2924/381; H01Q 1/00; H03K 17/102; H03K 17/6871
USPC ....................................................... 257/664
See application file for complete search history.

(56) References Cited

U.S. PATENT DOCUMENTS

| | | |
|---|---|---|
| 2002/0141168 A1 | 10/2002 | Tsukahara |
| 2006/0160520 A1 | 7/2006 | Miyazawa |
| 2008/0290475 A1* | 11/2008 | Sasaki ............... H01L 23/49822 257/664 |
| 2009/0167411 A1* | 7/2009 | Machida ............. H01L 27/0605 327/427 |
| 2009/0278207 A1 | 11/2009 | Greenberg et al. |
| 2011/0170231 A1 | 7/2011 | Chandrasekaran et al. |
| 2011/0294445 A1 | 12/2011 | Goto et al. |
| 2012/0112832 A1 | 5/2012 | Kawano et al. |
| 2012/0262231 A1 | 10/2012 | Scandiuzzo et al. |

* cited by examiner

STACKED RADIO FREQUENCY DEVICES

RELATED APPLICATIONS

This application is a continuation of U.S. patent application Ser. No. 14/543,428, filed on Nov. 17, 2014, now U.S. Pat. No. 10,050,002, issued Aug. 14, 2018, which claims the benefit of U.S. Provisional Patent Application No. 61/906,316, filed on Nov. 19, 2013, each of which is incorporated by reference herein in its entirety.

TECHNICAL FIELD

The present disclosure relates to integrated electronics, and in particular, to managing parasitic capacitance and voltage handling of stacked integrated electronic devices.

BACKGROUND

A stack of switching elements can be used as passive components for antenna tuning and various other radio frequency (RF) switching applications. The switching elements in the stack are coupled in series. The stack configuration enables a number of functions, including voltage and power handling capacity. For example, a FET (field-effect transistor) stack can be utilized to allow an RF switch to withstand high power under mismatch.

In many implementations, the voltage handling capability of a FET stack in an off state is a function of the number of FETs included in the stack. Typically, the voltage handling capacity of the stack increases as the number of FETs in the stack increases. However, simply increasing the number of FETs in a stack can have drawbacks. For example, the parasitic capacitance ($C_{off}$) of a stack is the capacitance of the stack when all of the FETs in the stack are each in an off state. Each FET in a stack contributes to the parasitic capacitance ($C_{off}$) that the stack inadvertently couples to the surrounding components. As such, each additional FET typically increases the parasitic capacitance ($C_{off}$) of the stack.

In many RF applications, there is a desire to control or carefully manage the parasitic capacitance ($C_{off}$) of the stack because of the drawbacks associated with the parasitic capacitance ($C_{off}$). For example, the parasitic capacitance ($C_{off}$) can adversely affect tuning and impedance matching. Tight tolerances for the parasitic capacitance ($C_{off}$) are often particularly important to downstream manufacturers that precisely tune and/or impedance-match antenna elements coupled to other components through one or more stack-based switches. Additionally, the resistance of the stack in the "on" state ($R_{on}$) is typically inversely related to the parasitic capacitance ($C_{off}$). As such, lowering the parasitic capacitance ($C_{off}$) typically increases the resistance ($R_{on}$).

BRIEF DESCRIPTION OF THE DRAWINGS

So that the present disclosure can be understood by those of ordinary skill in the art, a more detailed description may be had by reference to aspects of some illustrative implementations, some of which are shown in the accompanying drawings.

Figure 1:
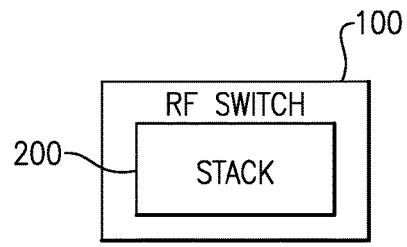
FIG. 1 is a schematic diagram of an implementation of a radio frequency switch.

In accordance with common practice various features shown in the drawings may not be drawn to scale, as the dimensions of various features may be arbitrarily expanded or reduced for clarity. Moreover, the drawings may not depict all of the aspects and/or variants of a given system, method or device admitted by the specification. Finally, like reference numerals are used to denote like features throughout the specification and figures.

SUMMARY

Various implementations of circuits, methods and devices within the scope of the appended claims each have several aspects, no single one of which is solely responsible for the attributes described herein. Without limiting the scope of the appended claims, some prominent features are described. After considering this disclosure, and particularly after considering the section entitled "Detailed Description," one will understand how the aspects of various implementations enable the management of parasitic capacitance and voltage handling of stacked integrated electronic devices.

Some implementations include a radio frequency switch arrangement having a ground plane, a stack and a first solder bump. The stack is arranged in relation to the ground plane, the stack including a plurality of switching elements coupled in series with one another, and the stack having first and second ends, the first end including a respective terminal of a first one of the plurality of switching elements. The first solder bump is coupled to the respective terminal of the first one of the plurality of switching elements such that at least a portion of the first solder bump overlaps with one or more of the plurality of switching elements, an overlap dimension set in relation to a first threshold value in order to set a respective contribution to a parasitic capacitance of the radio frequency switch arrangement.

Some implementations include a radio frequency switch module having a packaging substrate, a ground plane, a stack and a first solder bump. The packaging substrate is configured to receive a plurality of components. The ground plane is arranged on a first side of the packaging substrate.

The stack is arranged in relation to the ground plane on a second side of the packaging substrate, the stack including a plurality of switching elements coupled in series with one another, and the stack having first and second ends, the first end including a respective terminal of a first one of the plurality of switching elements. The first solder bump is coupled to the respective terminal of the first one of the plurality of switching elements such that at least a portion of the first solder bump overlaps with one or more of the plurality of switching elements, an overlap dimension set in relation to a first threshold value in order to set a respective contribution to a parasitic capacitance of the radio frequency switch arrangement.

Some implementations include a radio frequency device having a ground plane, a stack, a first solder bump, and an antenna. The stack is arranged in relation to the ground plane, the stack including a plurality of switching elements coupled in series with one another, and the stack having first and second ends, the first end including a respective terminal of a first one of the plurality of switching elements. The first solder bump is coupled to the respective terminal of the first one of the plurality of switching elements such that at least a portion of the first solder bump overlaps with one or more of the plurality of switching elements, an overlap dimension set in relation to a first threshold value in order to set a respective contribution to a parasitic capacitance of the radio frequency switch arrangement. The antenna is couple to a transceiver through the stack, the antenna configured to facilitate transmission or reception of a radio frequency signal.

Some implementations include a method of managing parasitic capacitance of a radio frequency switch arrangement. In some implementations, the method includes: setting a ground plane spacing offset in relation to a first threshold value in order to set a first parasitic capacitance contribution; setting a solder bump dimension in relation to a second threshold value in order to set a second parasitic capacitance contribution; setting a bump-FET (field effect transistor) overlap dimension in relation to a third threshold value in order to set a third parasitic capacitance contribution; and coupling at least one solder bump to DC ground to manage a fourth parasitic capacitance contribution.

DESCRIPTION

Numerous details are described herein in order to provide a thorough understanding of the example implementations illustrated in the accompanying drawings. However, the invention may be practiced without many of the specific details. Well-known methods, components, and circuits have not been described in exhaustive detail so as not to unnecessarily obscure more pertinent aspects of the implementations described herein.

The various implementations described herein include devices, arrangements and methods that enable management of parasitic capacitance ($C_{off}$) and/or voltage handling capacity of a stack of switching elements (e.g., FETs). Numerous details are described herein in order to provide a thorough understanding of the example implementations illustrated in the accompanying drawings. However, the invention may be practiced without many of the specific details. Well-known methods, components, and circuits have not been described in exhaustive detail so as not to unnecessarily obscure more pertinent aspects of the implementations described herein.

For example, one implementation includes a radio frequency switch arrangement including a ground plane, a stack of switching elements, and a first solder bump. The stack is arranged in relation to the ground plane. As noted above, the stack includes a plurality of switching elements coupled in series with one another. The stack has first and second ends. The first end includes a respective terminal of a first one of the plurality of switching elements. The first solder bump is coupled to the respective terminal of the first one of the plurality of switching elements such that at least a portion of the first solder bump overlaps with one or more of the plurality of switching elements. An overlap dimension is set in relation to a first threshold value in order to set a respective contribution to a parasitic capacitance of the radio frequency switch arrangement.

FIG. 1 is a schematic diagram of an implementation of a RF switch 100. While certain specific features are illustrated, those skilled in the art will appreciate from the present disclosure that various other features have not been illustrated for the sake of brevity and so as not to obscure more pertinent aspects of the example implementations disclosed herein. To that end, the RF switch 100 includes a plurality of switching elements (e.g., FETs) shown collectively as stack 200.

In some implementations, the plurality of switching elements included in the stack 200 includes at least one of FETs, bipolar junction transistors, GaAs transistors, diodes, and micro-electromechanical (MEMS) devices. In some implementations, a FET includes, for example, metal-oxide-semiconductor FETs (MOSFETs) such as SOI MOSFETs. Those of ordinary skill in the art will also appreciate that FETs as described herein can be implemented in other process technologies, including but not limited to HEMT, SOI, silicon-on-sapphire (SOS), and CMOS technologies. Additionally and/or alternatively, those of ordinary skill in the art will appreciate that other transistors types, such as BJTs and HBTs, are operable with or as an alternative to FETs in a number of circumstances.

Figure 2:
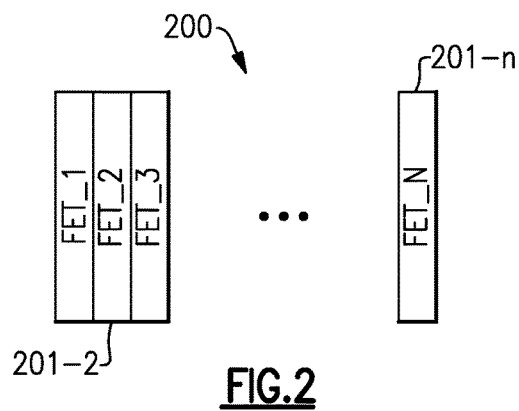
FIG. 2 is a schematic diagram of a stack of field effect transistors suitable for a radio frequency switch in accordance with some implementations.

FIG. 2 is a schematic diagram of a stack 200 of FETs suitable for a RF switch in accordance with some implementations. Generally, the stack 200 includes N FETs (e.g., "FET_2" indicated by 201-2, and "FET_N" indicated by 201-$n$) arranged in series, such that adjacent FETs are coupled source-to-drain. As described below in more detail with reference to FIG. 3, for the purpose of describing various implementations, the stack 200 is arranged so that one or more fingers of an individual FET extend along a transverse axis of the stack, so that the transistor gates are parallel to the primary current path through the stack 200.

Moreover, merely for the purpose of brevity and convenience, each FET (e.g., 201-2 and 201-$n$) or switching element in the stack 200 has substantially the same dimensions. However, those of ordinary skill in the art will appreciate that in various implementations some or all of the switching elements have varying dimensions with respect to one another. It will also be understood that variable-dimension and variable-geometry are used interchangeably in the description herein. Variable-dimension/variable-geometry include, for example, different sizes, different shapes, different configurations, or some combination thereof, of one or more parts associated with the switching elements. In some implementations, one or more parts associated with the switching elements include parts that are inherent to the switching elements. In such implementations, one can see that advantageous features provided by such variable-dimensions of the inherent part(s) of the switching elements can be beneficial, since additional external components are not necessarily needed.

Figure 3:
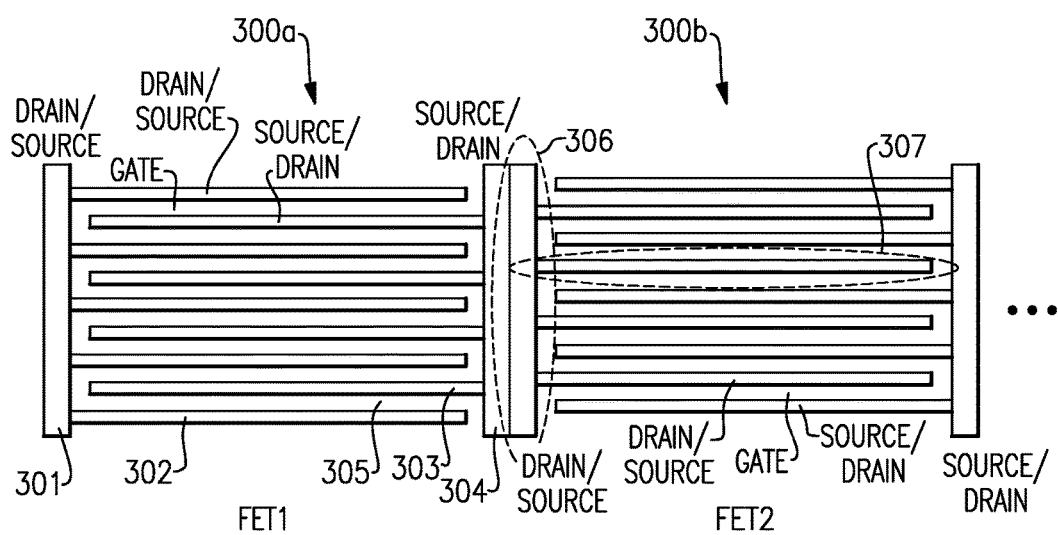
FIG. 3 is a schematic diagram of a plurality of field effect transistors arranged in series in accordance with some implementations.

FIG. 3 is a schematic diagram of an example stacked-series arrangement of two FETs 300$a$, 300$b$ in accordance with some implementations. While only two FETs are illustrated in FIG. 3 as a non-limiting example, those of ordinary skill in the art will appreciate that a stacked-series arrangement of FETs includes two or more FETs, and that in some implementations one or more aspects described herein are included in an implementation of a single FET or switching device. Moreover, while certain specific features are illustrated, those skilled in the art will appreciate from the present disclosure that various other features have not been illustrated for the sake of brevity and so as not to obscure more pertinent aspects of the example implementations disclosed herein.

To that end, the FETs 300a, 300b each have a finger configuration and are arranged is series with respect to one another. In some implementations, a first metal feature 304 on the right side of each FET (e.g., 300a) is provided as a source contact, and a second metal feature 301 on the left side is provided as a drain contact. Those of ordinary skill in the art will appreciate that a FET can be typically operated in reverse, such that second metal feature 301 functions as a source contact, and the first metal feature 304 functions as a drain contact. In some implementations, the drain contact 301 is arranged to function as an output (e.g., an RF output) of the FETs 300a, 300b arranged in series. As such, the source contact 304 of the FET 300a is coupled to the drain contact 301 of the FET 300b. Similarly, the source 304 contact of the FET 300b can be electrically connected to a drain contact of another FET, etc.

In some FETs (e.g., 300a), a first plurality of finger features 303 are electrically connected to the respective source contact 304, and a second plurality of finger features 302 are electrically connected to the drain contact 301. The first and second pluralities of finger features 303, 302 are arranged in an interleaved configuration with respect to each other. Accordingly, as is generally understood, a respective gate feature 305 can be provided in each of the corresponding spaces between the interleaved finger features 303, 302 associated with the source and drain contacts 304, 301.

Figure 4:
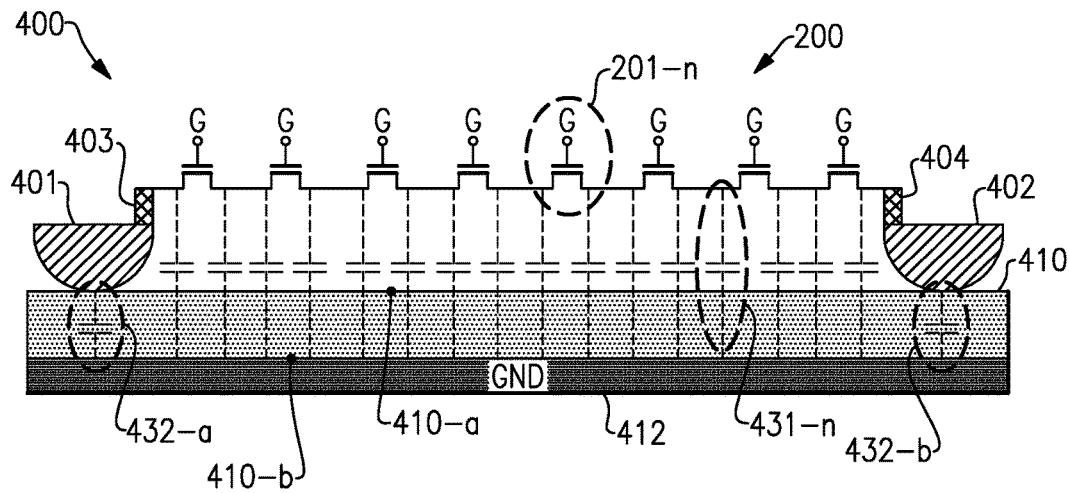
FIG. 4 is a schematic diagram of a radio frequency switch in accordance with some implementations.

FIG. 4 is a schematic diagram of a RF switch arrangement 400 in accordance with some implementations. While certain specific features are illustrated, those skilled in the art will appreciate from the present disclosure that various other features have not been illustrated for the sake of brevity and so as not to obscure more pertinent aspects of the example implementations disclosed herein. To that end, the RF switch arrangement 400 includes a FET stack 200, a first metal contact 403, a second metal contact 404, a first solder bump 401, a second solder bump 402, a dielectric board 410 (e.g., a substrate of a printed circuit board or the like), and a conductive ground plane 412.

The FET stack 200 includes a number of FETs (e.g., FET 201-n) arranged in series, such that adjacent FETs are coupled source-to-drain. In other words, with the exception of the FETs on the ends of the FET stack 200, each FET (e.g., FET 201-n) is generally coupled so that the source of the FET is coupled to the drain of an adjacent FET, and the drain of the FET is coupled to the source of another adjacent FET. The FET stack 200 is also coupled between the first and second metal contacts 401, 403 to enable coupling to other components. To that end, the FETs on the respective ends of the FET stack 200 each have a drain or source coupled to one of the first and second metal contacts 401, 403 as opposed to another FET.

The first metal contact 403 is coupled to the first solder bump 401. The second metal contact 404 is coupled to the second solder bump 402. The first and second solder bumps 401, 402 are provided to couple the respective ends of the FET stack 200 to one or more other components (e.g., an antenna). To that end, the first and second solder bumps 401, 402 are arranged on a first surface 410-a of the board 410, which typically includes one or more conductive traces (not shown) leading to one or more other components (again, not shown). The ground plane 412 is arranged adjacent to a second surface 410-b of the board 410.

Each source and drain of each FET in the FET stack 200 typically includes a respective metal feature (e.g. a via or contact). The respective metal feature at each source and drain forms a corresponding parasitic capacitive element (e.g., indicated by 431-n) in combination with the ground plane 412. The total capacitance of the summation of these elements contributes to the parasitic capacitance ($C_{off}$) of the FET stack 200. As indicated by 432-a and 432-b, the first and second solder bumps 401, 402 also contribute to the parasitic capacitance ($C_{off}$).

Figure 5:
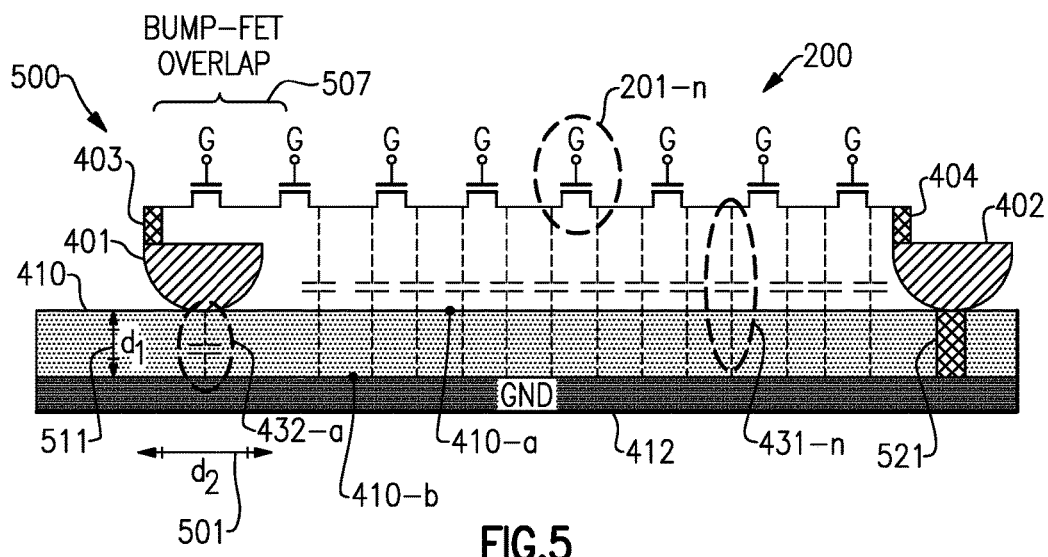
FIG. 5 is a schematic diagram of a radio frequency switch in accordance with some implementations.

FIG. 5 is a schematic diagram of a RF switch arrangement 500, in accordance with some implementations, which includes aspects that enable management of the parasitic capacitance ($C_{off}$). The RF switch 500 illustrated in FIG. 5 is similar to and adapted from the RF switch illustrated in FIG. 4. Elements common to both implementations include common reference numbers, and only the differences between FIGS. 4 and 5 are described herein for the sake of brevity. Again, while certain specific features are illustrated, those skilled in the art will appreciate from the present disclosure that various other features have not been illustrated for the sake of brevity, and so as not to obscure more pertinent aspects of the implementations disclosed herein.

To that end, in some implementations, the RF switch 500 arrangement additionally includes a bump-FET overlap 507. The bump-FET overlap 507 is provided by arranging the first solder bump 401 between the board 410 and one or more FETs of the FET stack 200. As a result, the parasitic capacitance contributed by the one or more FETs is substantially replaced by the parasitic capacitance of the first solder bump 401 alone, which thus reduces the total parasitic capacitance ($C_{off}$) of the RF switch arrangement 500. In some implementations, a bump-FET overlap dimension (i.e., the extent of the bump-FET overlap) is set to at least a threshold value in order to set a respective contribution to the parasitic capacitance ($C_{off}$) of the RF switch arrangement 500.

Additionally and/or alternatively, in some implementations, the ground plane 412 is arranged further away from the FET stack 200 and solder bumps 401, 402 in order to reduce the total parasitic capacitance ($C_{off}$) of the RF switch arrangement 500. For example, a distance ($d_1$) 511 between the ground plane 412 and at least one of the FET stack 200 and solder bumps 401, 402 is set to at least a threshold value in order to set a respective contribution to the total parasitic capacitance ($C_{off}$) of the RF switch arrangement 500. As described in greater detail below with reference to FIG. 6, in some implementations, a ground plane is separated from at least one of a FET stack and solder bumps by approximately 300 µm in order to manage the parasitic capacitance ($C_{off}$).

Additionally and/or alternatively, in some implementations, one or more of the first and second solder bumps 401, 402 are sized in order to reduce the parasitic capacitance that each contributes to the total parasitic capacitance ($C_{off}$) of the RF switch arrangement 500. In other words, a diameter ($d_2$) 501 of a solder bump is set to a threshold value in order set a respective contribution of the total parasitic capacitance ($C_{off}$) of the RF switch arrangement 500. As described in greater detail below with reference to FIGS. 7A-7C, in some implementations, the diameter ($d_2$) 501 of a solder bump is reduced in order reduce a respective contribution to the total parasitic capacitance ($C_{off}$) of the RF switch arrangement 500.

Additionally and/or alternatively, in some implementations, one of the first and second solder bumps 401, 402 is coupled to the ground plane 412 in order to reduce a respective contribution to the total parasitic capacitance ($C_{off}$) of the RF switch arrangement 500. For example, as shown in FIG. 5, the second solder bump 402 is coupled to the ground plane 412 through a via-connector 521 that extends through the board 410. The electrical connection between the second solder bump 402 and the ground plane 412 substantially removes the parasitic capacitance contributed by the second solder bump 402 because a voltage differential between the second solder bump 402 and the ground plane 412 is substantially eliminated. This type of arrangement is beneficial in implementations that include one end of the FET stack 200 coupled to DC ground (e.g., the ground plane 412).

Figure 6:
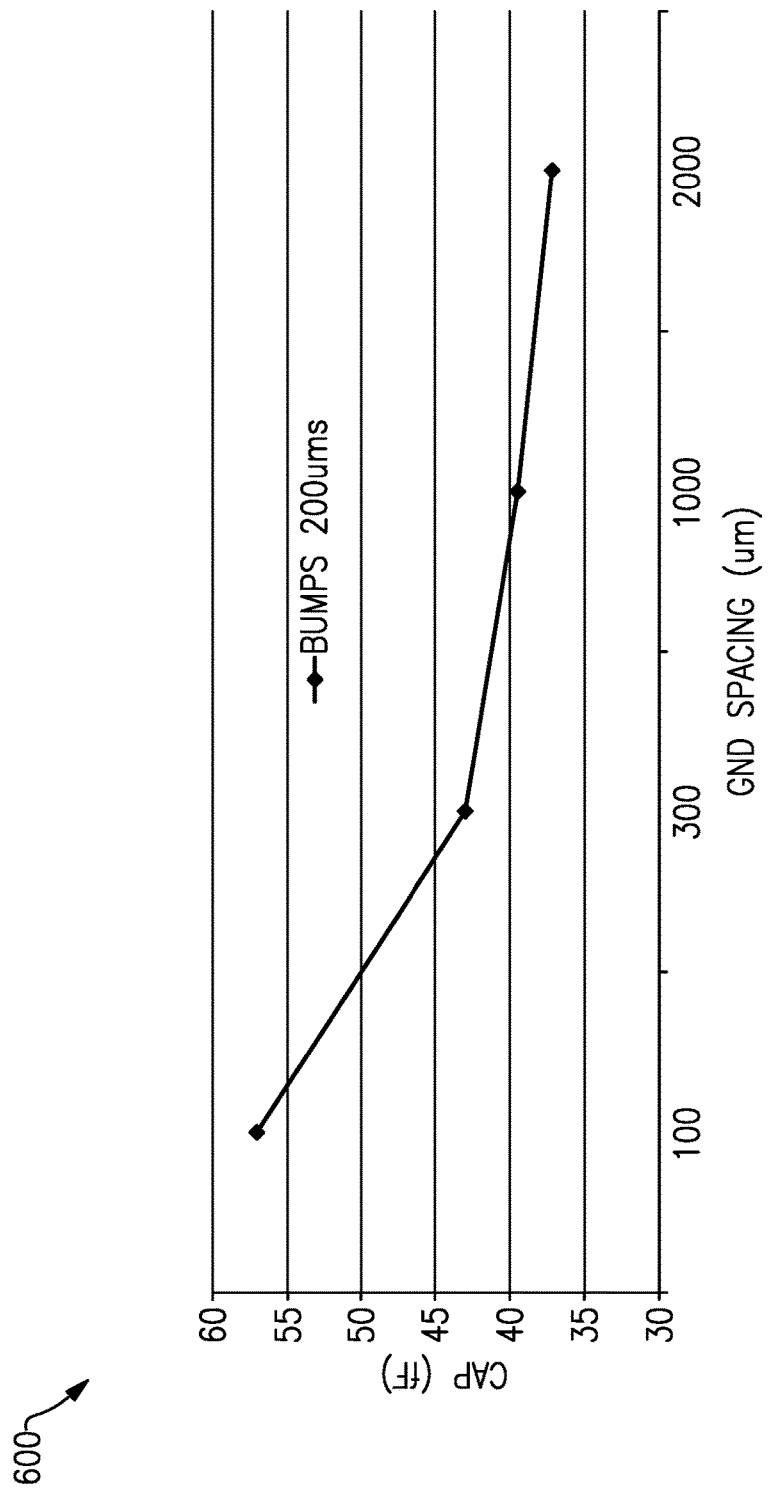
FIG. 6 is a performance diagram showing parasitic capacitance as a function of ground plane offset spacing in accordance with some implementations.

FIG. 6 is a performance diagram 600 showing parasitic capacitance ($C_{off}$) as a function of the ground plane offset spacing (e.g., $d_1$ in FIG. 5) in accordance with some implementations. In the example shown in the performance diagram 600, a 200 μm diameter solder bump adds at least 40 fF of parasitic capacitance when the ground plane is 300 μm away. Additionally, in some implementations, once the ground plane is more than about 1 mm from the solder bump, the parasitic capacitance contribution does not significantly change in response to increases in the ground plane spacing.

Figure 7A:
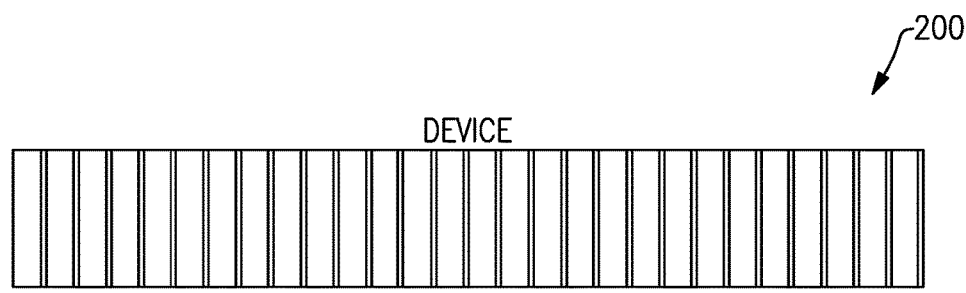
FIGS. 7A-7C are schematic diagrams showing the parasitic capacitance added to a FET stack by solder bumps of various sizes in accordance with some implementations.
Figure 7B:
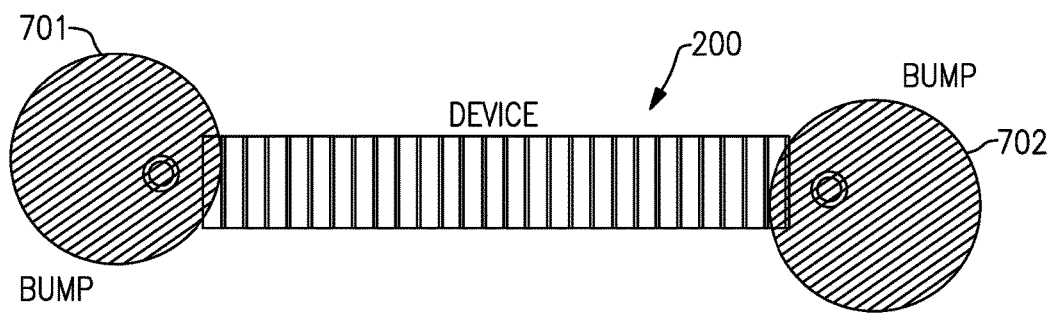
Figure 7C:
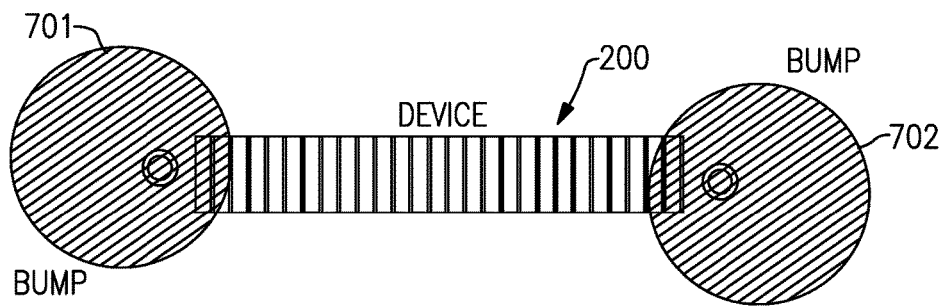

FIGS. 7A-7C is a schematic diagram showing the parasitic capacitance added to a FET stack 200 by solder bumps 701, 702 of various sizes in accordance with some implementations. More specifically, FIG. 7A shows the parasitic capacitance ($C_{off}$) of the FET stack 200 that includes twenty-eight 2 mm FETs. The parasitic capacitance ($C_{off}$) is approximately 45.43 fF. FIG. 7B shows that the parasitic capacitance ($C_{off}$) increases to approximately 88.57 fF when two 200 μm diameter solder bumps 701, 702 are coupled at respective ends of the FET stack 200. FIG. 7C shows that the parasitic capacitance ($C_{off}$) increases to approximately 102.02 fF when two 250 μm diameter solder bumps 701, 702 are coupled at respective ends of the FET stack 200. As such, in at least some implementations, larger solder bumps add more parasitic capacitance than smaller solder bumps. Therefore, in some implementations, the parasitic capacitance ($C_{off}$) of the FET stack 200 can be managed by adjusting the size of one or more solder bumps coupled to the FET stack 200.

Figure 8A:
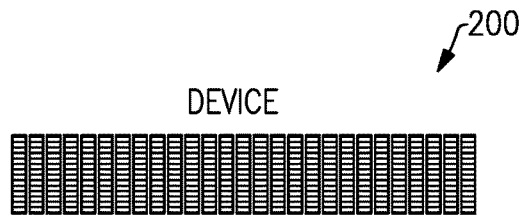
FIGS. 8A-8D are schematic diagrams showing the parasitic capacitance added to a FET stack by various arrangements of solder bumps in accordance with some implementations.
Figure 8B:
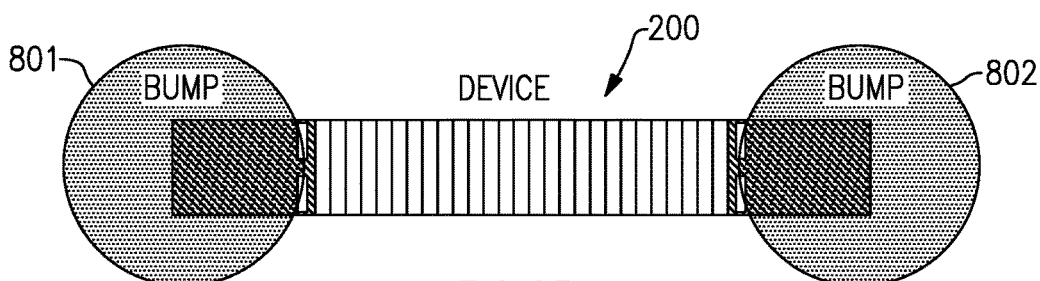
Figure 8C:
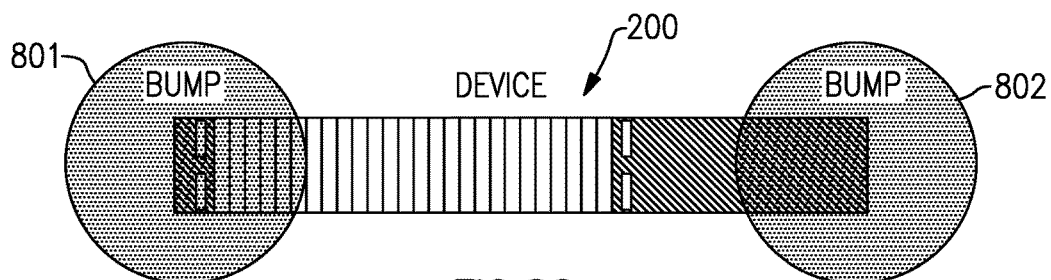
Figure 8D:
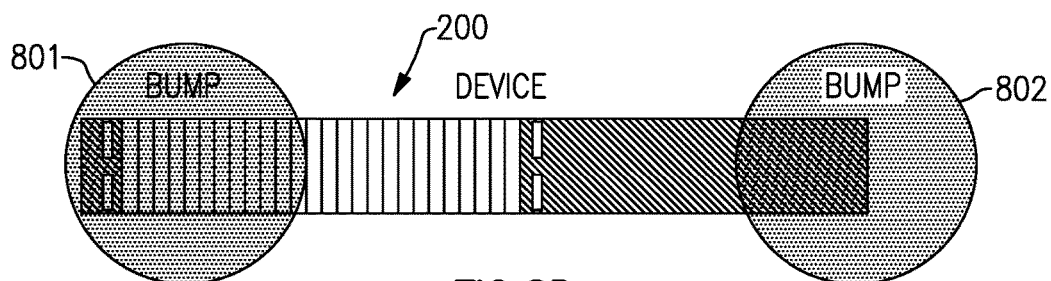

FIGS. 8A-8D is a schematic diagram showing the parasitic capacitance added to a FET stack 200 by various arrangements of solder bumps 801, 802 in accordance with some implementations. More specifically, FIG. 8A shows the parasitic capacitance ($C_{off}$) of the FET stack 200 that includes twenty-seven 1 mm FETs. The parasitic capacitance ($C_{off}$) is approximately 28.23 fF. FIG. 8B shows that the parasitic capacitance ($C_{off}$) increases to approximately 57.62 fF when two 220 μm diameter solder bumps 801, 802 are coupled at respective ends of the FET stack 200 and overlap respective ends of the FET stack 200. FIG. 8C shows that the parasitic capacitance ($C_{off}$) decreases to approximately 17.40 fF when the two 220 μm diameter solder bumps 801, 802 are coupled at the respective ends of the FET stack 200, but almost half the input bump is now overlapping as compared to FIG. 8B. FIG. 8D shows that the parasitic capacitance ($C_{off}$) reduces compared to FIG. 8B but similar to FIG. 8C where the parasitic capacitance ($C_{off}$) increases to approximately 21.23 fF when the input 220 μm diameter solder bumps 801, 802 are coupled at the respective ends of the FET stack 200 with full overlap with the input end of the FET stack 200. Therefore, in at least some implementations, bump-FET overlap reduces parasitic capacitance as compared to little or less overlap. In turn, in some implementations, the total parasitic capacitance ($C_{off}$) of the FET stack 200 can be managed by adjusting the amount of bump-FET overlap. Additionally, in some implementations, the process and/or mechanism for changing the total parasitic capacitance ($C_{off}$) is substantially decoupled from impacting the resistance ($R_{on}$) of the FET stack 200 in the "on" state.

Figure 9:
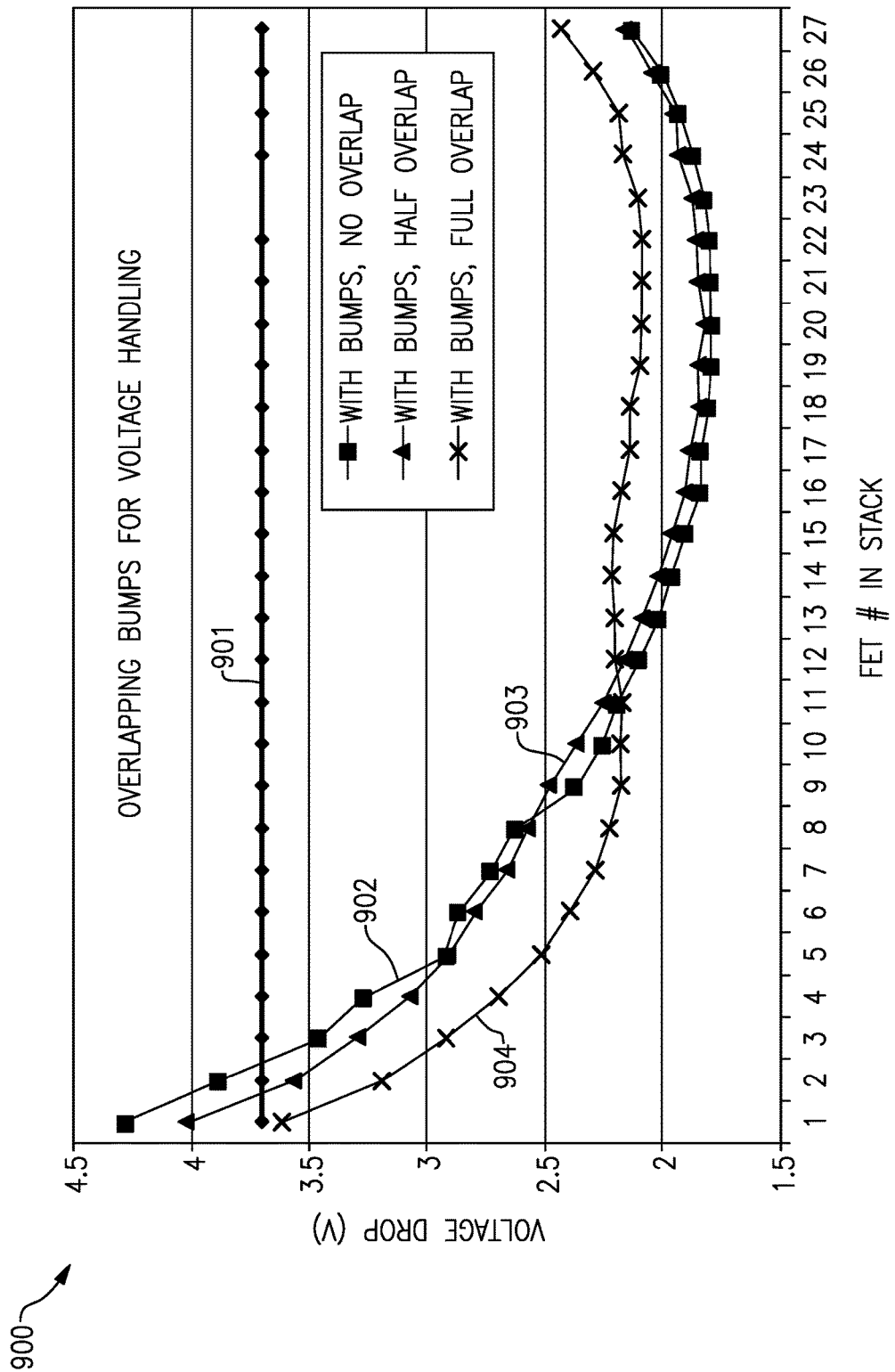
FIG. 9 is a performance diagram showing the voltage handling characteristic of a range of FETs in a stack as a function of the amount of bump-FET overlap in accordance with some implementations.

FIG. 9 is a performance diagram 900 showing the voltage handling characteristic of a range of FETs in a stack as a function of the amount of bump-FET overlap in accordance with some implementations. In the example shown in the performance diagram 900, threshold curve 901 is an estimated threshold above which a FET will go into breakdown. The voltage handling curves 903, 904 shows the improvement for the first few FETs in a stack for implementations in which there is some amount of bump-FET overlap, as compared to the voltage handling performance 902 for a FET stack without substantial bump-FET overlap. In the example shown, the curve 904, for the implementation in which there is a substantially full bump-FET overlap, remains below threshold curve 901 for substantially all FETs in the stack, indicating improved voltage handling. As such, FETs within such a stack are less likely to go into breakdown when subjected to higher voltages.

Figure 10:
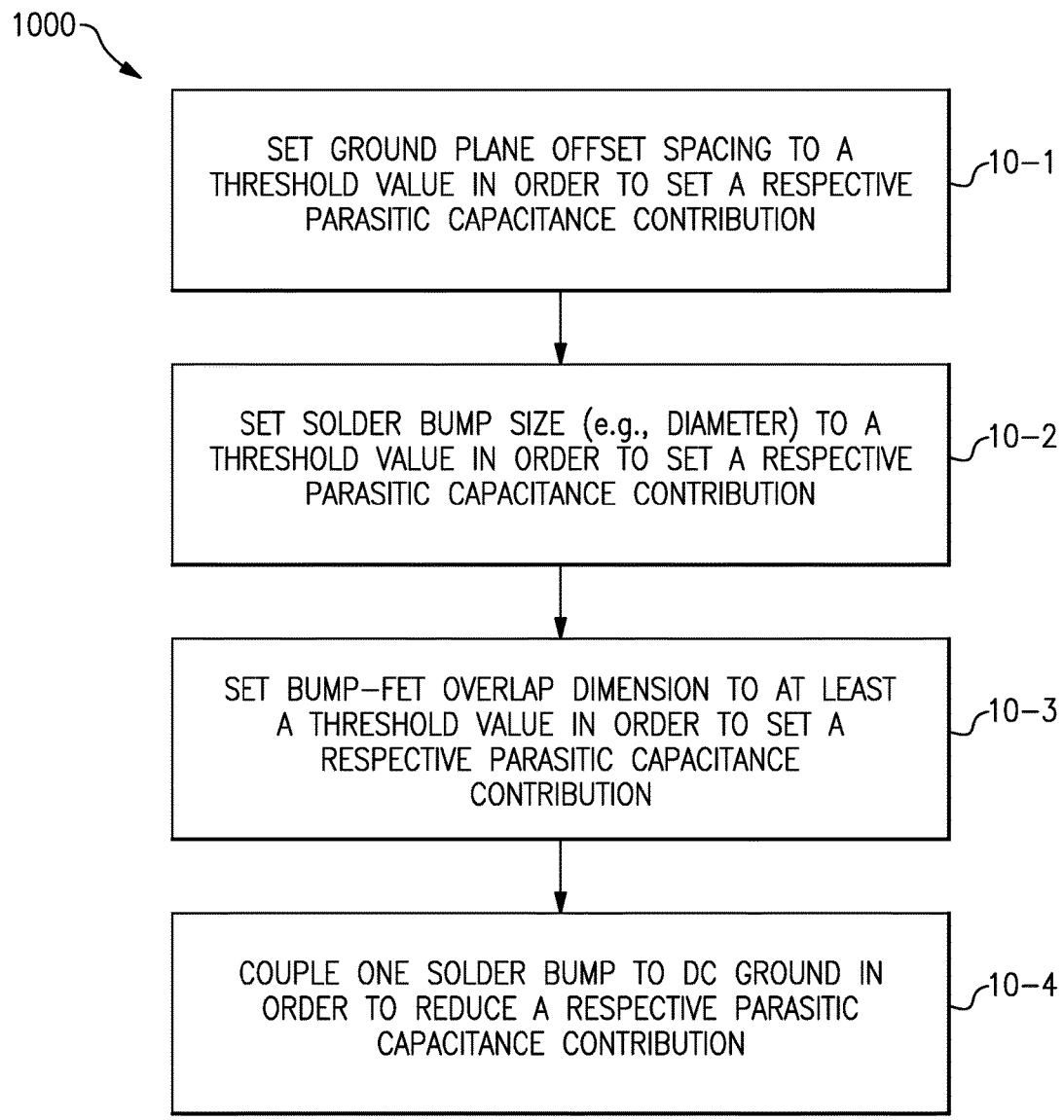
FIG. 10 is a flowchart representation of a method of arranging at least one of the ground plane relative to a switching element stack and one or more solder bumps relative to the stack in order to manage parasitic capacitance and/or voltage handling capability in accordance with some implementations.

FIG. 10 is a flowchart representation of a method 1000 of arranging at least one of the ground plane relative to a switching element stack and one or more solder bumps relative to the stack in order to manage parasitic capacitance ($C_{off}$) and/or voltage handling capability. In some implementations, the method is performed during at least one of the manufacture of a switching element stack and the integration and/or packaging of the switching element stack with one or more other components. Briefly, the method 1000 includes adjusting one or more arrangements in relation to corresponding threshold values to manage respective contributions of parasitic capacitance.

To that end, as represented by block 10-1, the method 1000 includes setting a ground plane spacing offset in relation to a first threshold value in order to set a respective parasitic capacitance contribution. As represented by block 10-2, the method 1000 includes setting a solder bump dimension in relation to a second threshold value in order to set a respective parasitic capacitance contribution. As represented by block 10-3, the method 1000 includes setting a bump-FET overlap dimension in relation to a third threshold value in order to set a respective parasitic capacitance contribution. As represented by block 10-4, the method 1000 includes coupling at least one solder bump to DC ground to manage a respective parasitic capacitance contribution.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, a wireless router, a wireless access point, a wireless base station, etc. That is, those skilled in the art will also appreciate from the present disclosure that in various implementations the power amplifier open loop current clamp may be included in various devices, such as a computer, a laptop computer, a tablet device, a netbook, an internet kiosk, a personal digital assistant, an optical modem, a base station, a repeater, a wireless router, a mobile phone, a smartphone, a gaming device, a computer server, or any other computing device. In various implementations, such devices include one or more processors, one or more types of memory, a display and/or other user interface components such as a keyboard, a touch screen display, a mouse, a track-pad, a digital camera and/or any number of supplemental devices to add functionality.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

While various aspects of implementations within the scope of the appended claims are described above, it should be apparent that the various features of implementations described above may be embodied in a wide variety of forms and that any specific structure and/or function described above is merely illustrative. Based on the present disclosure one skilled in the art should appreciate that an aspect described herein may be implemented independently of any other aspects and that two or more of these aspects may be combined in various ways. For example, an apparatus may be implemented and/or a method may be practiced using any number of the aspects set forth herein. In addition, such an apparatus may be implemented and/or such a method may be practiced using other structure and/or functionality in addition to or other than one or more of the aspects set forth herein.

It will also be understood that, although the terms "first," "second," etc. may be used herein to describe various elements, these elements should not be limited by these terms. These terms are only used to distinguish one element from another. For example, a first contact could be termed a second contact, and, similarly, a second contact could be termed a first contact, which changing the meaning of the description, so long as all occurrences of the "first contact" are renamed consistently and all occurrences of the second contact are renamed consistently. The first contact and the second contact are both contacts, but they are not the same contact.

The terminology used herein is for the purpose of describing particular embodiments only and is not intended to be limiting of the claims. As used in the description of the embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

What is claimed is:

1. A radio frequency switch arrangement comprising:
   a ground plane;
   a stack arranged in relation to the ground plane, the stack including a plurality of switching elements coupled in series with one another, and the stack having first and second ends, the first end including a respective terminal of a first one of the plurality of switching elements; and
   a first solder bump coupled to the respective terminal of the first one of the plurality of switching elements such that at least a portion of the first solder bump overlaps with one or more of the plurality of switching elements, an overlap dimension set in relation to a first threshold value in order to set a respective contribution to a parasitic capacitance of the radio frequency switch arrangement.

2. The radio frequency switch arrangement of claim 1 wherein the plurality of switching elements includes field effect transistors, at least some of the field effect transistors each being coupled source-to-drain with one or more adjacent field effect transistors.

3. The radio frequency switch arrangement of claim 1 wherein the plurality of switching elements includes at least one of field effect transistors, bipolar junction transistors, GaAs transistors, diodes, and micro-electromechanical devices.

4. The radio frequency switch arrangement of claim 1 further comprising a dielectric board having first and second planar surfaces, the first solder bump arranged in association with the first planar surface, the ground plane arranged in association with the second planar surface, and the thickness of the dielectric board set in relation to a second threshold value in order to set a respective contribution to the parasitic capacitance.

5. The radio frequency switch arrangement of claim 1 wherein the first solder bump is characterized by a size dimension, and the size dimension is set in relation to a second threshold value in order to set a respective contribution to the parasitic capacitance.

6. The radio frequency switch arrangement of claim 5 wherein the size dimension includes one of a radius and a diameter of the first solder bump.

7. The radio frequency switch arrangement of claim 1 further comprising a second solder bump coupled to the ground plane and to a respective terminal of a second one of the plurality of switching elements included on the second end of the stack.

8. The radio frequency switch arrangement of claim 7 further comprising a connection to an antenna element from one of the first and second ends of the stack.

9. The radio frequency switch arrangement of claim 1 wherein the overlap dimension includes and is proximate to the first one of the plurality of switching elements.

10. A radio frequency switch module comprising:
    a packaging substrate configured to receive a plurality of components;
    a ground plane arranged on a first side of the packaging substrate;
    a stack arranged in relation to the ground plane on a second side of the packaging substrate, the stack including a plurality of switching elements coupled in series with one another, and the stack having first and second ends, the first end including a respective terminal of a first one of the plurality of switching elements; and a first solder bump coupled to the respective terminal of the first one of the plurality of switching elements such that at least a portion of the first solder bump overlaps with one or more of the plurality of switching elements, an overlap dimension set in relation to a first threshold value in order to set a respective contribution to a parasitic capacitance of the stack.

11. The radio frequency switch module of claim 10 wherein the thickness of the packaging substrate is set in relation to a second threshold value in order to set a respective contribution to the parasitic capacitance.

12. The radio frequency switch module of claim 10 wherein the first solder bump is characterized by a size dimension, and the size dimension is set in relation to a second threshold value in order to set a respective contribution to the parasitic capacitance.

13. The radio frequency switch module of claim 10 further comprising a second solder bump coupled to the ground plane through the packaging substrate and to a respective terminal of a second one of the plurality of switching elements included on the second end of the stack.

14. The radio frequency switch module of claim 10 wherein the overlap dimension includes and is proximate to the first one of the plurality of switching elements.

15. A radio frequency device comprising:
a ground plane;
a stack arranged in relation to the ground plane, the stack including a plurality of switching elements coupled in series with one another, and the stack having first and second ends, the first end including a respective terminal of a first one of the plurality of switching elements;

a first solder bump coupled to the respective terminal of the first one of the plurality of switching elements such that at least a portion of the first solder bump overlaps with one or more of the plurality of switching elements, an overlap dimension set in relation to a first threshold value in order to set a respective contribution to a parasitic capacitance of the stack; and an antenna coupled to a transceiver through the stack, the antenna configured to facilitate transmission or reception of a radio frequency signal.

16. The radio frequency device of claim 15 wherein the radio frequency device includes a wireless device.

17. The radio frequency device of claim 16 wherein the wireless device includes at least one of a base station, a repeater, a cellular phone, a smartphone, a computer, a laptop, a tablet computer, and a peripheral device.

18. The radio frequency device of claim 15 further comprising a dielectric board having first and second planar surfaces, the first solder bump arranged in association with the first planar surface, the ground plane arranged in association with the second planar surface, and the thickness of the dielectric board set in relation to a second threshold value in order to set a respective contribution to the parasitic capacitance.

19. The radio frequency device of claim 15 wherein the first solder bump is characterized by a size dimension, and the size dimension is set in relation to a second threshold value in order to set a respective contribution to the parasitic capacitance.

20. The radio frequency device of claim 15 further comprising a second solder bump coupled to the ground plane through the packaging substrate and to a respective terminal of a second one of the plurality of switching elements included on the second end of the stack.

* * * * *